US007659476B2

(12) United States Patent  
Hruby et al.

(10) Patent No.: US 7,659,476 B2
(45) Date of Patent: Feb. 9, 2010

(54) FRAME ARRANGEMENT FOR A TELECOMMUNICATIONS CABINET

(75) Inventors: Kevin L. Hruby, Minnetonka, MN (US); Timothy Haataja, Prior Lake, MN (US)

(73) Assignee: ADC Telecommunication, Inc., Eden Prairie, MN (US)

( * ) Notice: Subject to any disclaimer, the term of this patent is extended or adjusted under 35 U.S.C. 154(b) by 478 days.

(21) Appl. No.: 11/799,038

(22) Filed: Apr. 30, 2007

(65) Prior Publication Data

US 2008/0265720 A1 Oct. 30, 2008

(51) Int. Cl.
*H01J 5/00* (2006.01)

(52) U.S. Cl. .............................. 174/50; 174/58; 174/60; 174/17 R; 248/906; 213/265.4; 439/535

(58) Field of Classification Search .................. 174/50, 174/58, 60, 17 R, 59, 62; 248/906; 439/535; 211/26, 191; 312/265.1–265.4, 223.3; 220/4.02, 220/3.6, 3.8, 3.2; 361/690, 692, 695, 600, 361/796

See application file for complete search history.

(56) References Cited

U.S. PATENT DOCUMENTS

| 4,997,240 | A |   | 3/1991 | Schmalzl et al. |
| 5,388,903 | A | * | 2/1995 | Jones et al. ............ 312/334.29 |
| 5,536,079 | A |   | 7/1996 | Kostić |
| 5,749,476 | A | * | 5/1998 | Besserer et al. ................ 211/26 |
| 6,005,188 | A | * | 12/1999 | Teichler et al. ................ 174/50 |
| 6,036,290 | A |   | 3/2000 | Jancsek et al. |
| 6,075,207 | A |   | 6/2000 | Sielaff et al. |
| 6,223,908 | B1 | * | 5/2001 | Kurtsman ..................... 211/26 |
| 6,299,268 | B1 | * | 10/2001 | Carle et al. .............. 312/265.4 |
| 6,632,995 | B1 |   | 10/2003 | Knieriem |
| 6,657,861 | B2 |   | 12/2003 | Irmer |
| 6,796,437 | B2 |   | 9/2004 | Krampotich et al. |
| 7,277,273 | B2 | * | 10/2007 | Smith et al. ............ 361/679.01 |
| 7,495,169 | B2 | * | 2/2009 | Adducci et al. ................ 174/50 |
| 2002/0140325 | A1 |   | 10/2002 | Webster et al. |
| 2004/0114326 | A1 |   | 6/2004 | Dodgen et al. |
| 2006/0220506 | A1 |   | 10/2006 | Irmer et al. |
| 2007/0053162 | A1 |   | 3/2007 | Keenan et al. |

FOREIGN PATENT DOCUMENTS

| DE | 36 12511 A1 | 1/1987 |
| DE | 36 14725 A1 | 11/1987 |
| DE | 199 41 413 A1 | 3/2001 |
| EP | 0 514 668 A1 | 11/1992 |
| EP | 0 810 704 A2 | 12/1997 |
| EP | 0 849 850 A1 | 6/1998 |
| EP | 1 458 073 A2 | 9/2004 |
| FR | 2 785 100 | 4/2000 |
| WO | WO 02/075883 A1 | 9/2002 |

OTHER PUBLICATIONS

Panduite® *Net-Acces*™ Cabinet; Brochure No. SA-RKCB06; 8 pages; dated Aug. 2006.

(Continued)

*Primary Examiner*—Dhiru R Patel
(74) *Attorney, Agent, or Firm*—Merchant & Gould P.C.

(57) ABSTRACT

A telecommunications cabinet including a frame arrangement having an inner frame and an outer frame. The frame arrangement of the telecommunications cabinet being constructed to withstand particular-rated seismic events while still providing the needed thermal cooling capacity to maintain proper equipment operations.

25 Claims, 5 Drawing Sheets

OTHER PUBLICATIONS

DAMAC Products, Inc.; Seismic Frame FS84BP-3 W/10-32 Tapped Rails; 1 page; Admitted Prior Art.

DAMAC Products, Inc.; Seismic Cabinet Sample Part # CS84EPBIBSF-3; 1 page; Admitted Prior Art.

* cited by examiner

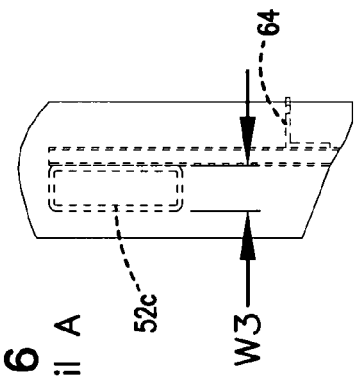
FIG.6
Detail A
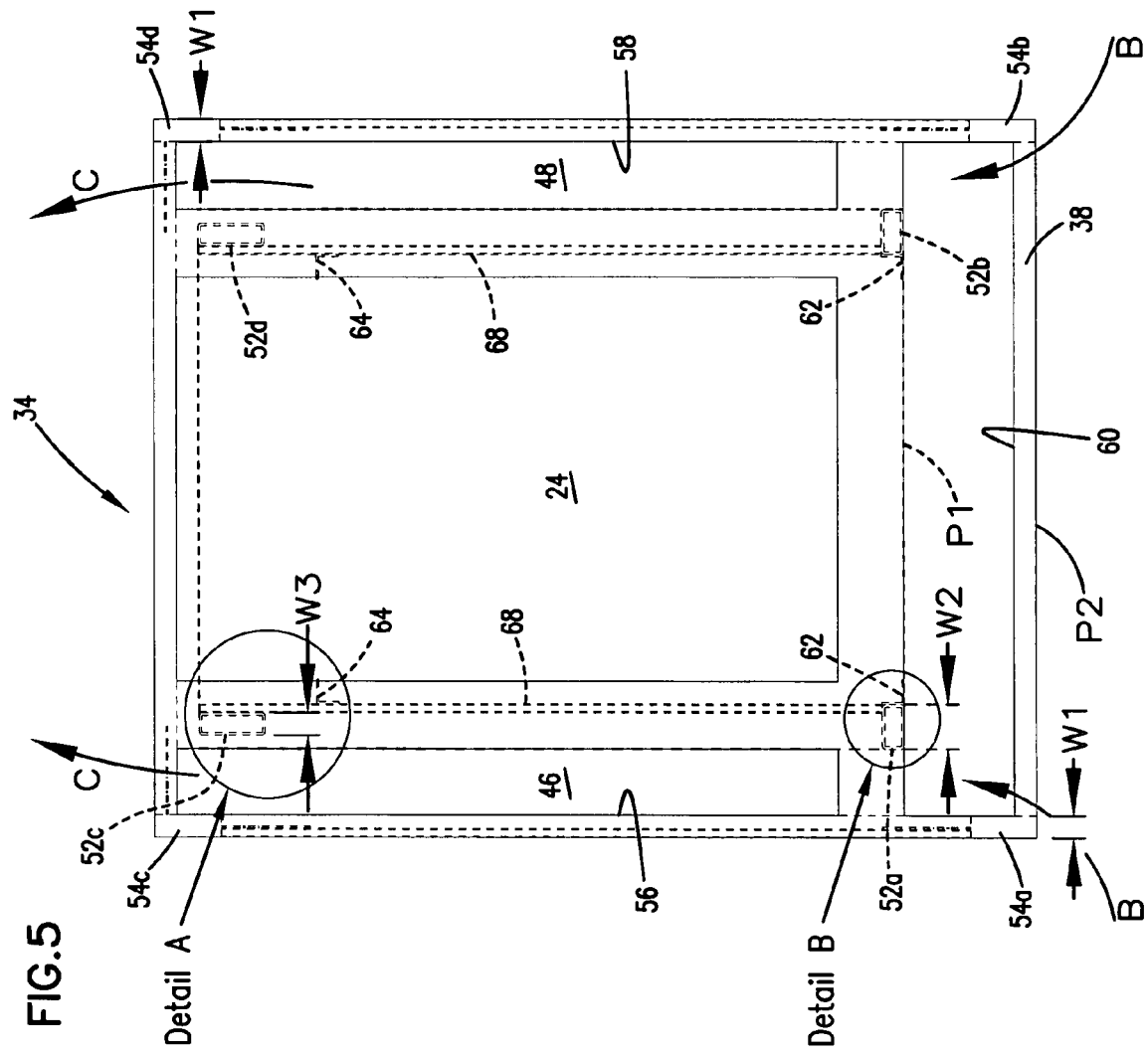
FIG.7
Detail B
FIG.5

FRAME ARRANGEMENT FOR A TELECOMMUNICATIONS CABINET

FIELD OF THE INVENTION

This disclosure relates to equipment structures for use in the telecommunications industry, and associated methods. More specifically, this disclosure relates to a telecommunications cabinet that houses telecommunications equipment.

BACKGROUND OF THE INVENTION

Telecommunications equipment can generate a significant amount of heat and require large volumes of air for cooling. Due to limited space in telecommunication facilities, telecommunications equipment is typically stacked within cabinets that are aligned side-by-side. As can be understood, dissipation of heat generated by the equipment is critical to maintaining proper operation of the equipment. Many cabinets that house heat-generating equipment are therefore constructed with air circulation in mind, and accordingly have framework arrangements that are structurally less than robust. While these arrangements may address cooling requirements, they are not suitable for use in areas that experience seismic events.

Framework arrangements constructed to withstand seismic events, on the other hand, typically have four robust corner posts that act as main load-bearing structures. The robust 4-post arrangements, however, interfere with cool-air intake and heated-air exhaust necessary to maintaining proper equipment operations, especially for equipment with internal side-to-side air circulation.

Improvement of equipment structures to provide a more robust structural construction that withstands certain seismic events and that still manages thermal cooling requirements is needed.

SUMMARY OF THE INVENTION

The present disclosure relates to a telecommunications cabinet having a frame arrangement that can withstand particular-rated seismic events while still providing the needed thermal cooling capacity to maintain proper equipment operations. One feature of the present disclosure relates to a frame arrangement having an inner frame and an outer frame. Another feature of the present disclosure relates to a frame arrangement having ventilation spaces.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

BRIEF DESCRIPTION OF THE DRAWINGS

FIG. 5 is a top plan view of the cabinet frame arrangement of FIG. 3;

FIG. 6 is an enlarged detail view of a portion of the cabinet frame arrangement of FIG. 5; and FIG. 7 is another enlarged detail view of another portion of the cabinet frame arrangement of FIG. 5.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
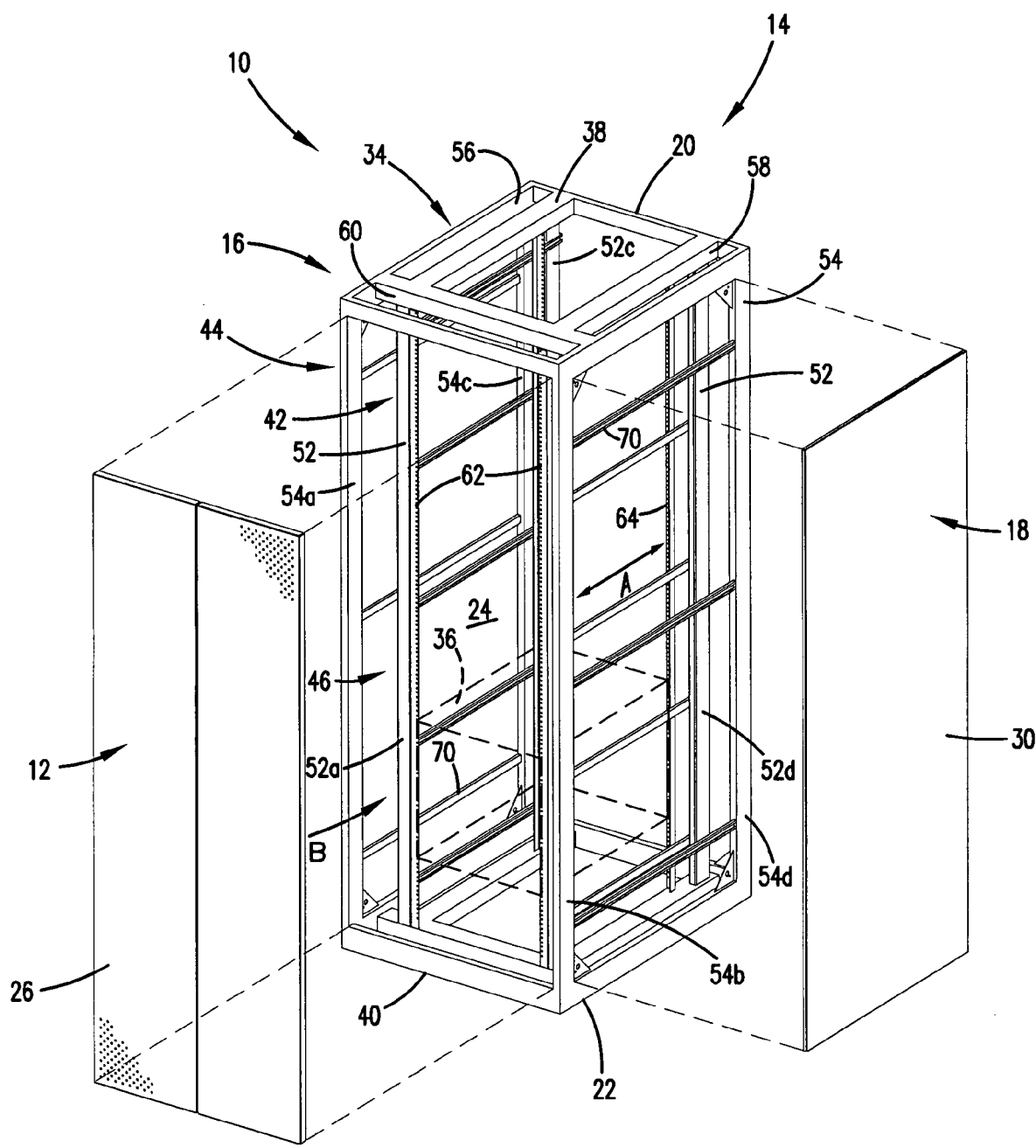
FIG. 1 is a top, front perspective view of one embodiment of a telecommunications cabinet having a cabinet frame arrangement in accordance with the principles disclosed.

FIG. 1 illustrates one embodiment of telecommunications cabinet 10 in accordance with the principles disclosed. As will be described in greater detail hereinafter, the telecommunications cabinet 10 is designed to withstand Zone 4 seismic events. Zone 4 seismic events are events having a magnitude of 7.0 to 8.3 on the Richter scale, during which facility equipment is subjected to ground accelerations of between 0.4 and 0.8 gs and building accelerations of between 0.6 and 1.0 gs.

The present telecommunications cabinet 10 generally has a front 12, a rear 14, a first side 16, a second opposing side 18, a top 20, and a bottom 22. The front 12 and the rear 14 of the cabinet are defined by mesh panels or doors 26 (only the front mesh panels/doors shown). The mesh panels 26 are constructed to facilitate airflow passage through an interior region 24 of the cabinet. The sides 16, 18 of the cabinet are also defined by panels 30 (only one side panel shown). The side panels (e.g., 30) are typically made of a more solid construction. While the illustrated cabinet is shown with panels, as will be understood, the principles disclosed can be utilized in cabinet applications that do not have enclosing panels.

The telecommunications cabinet includes a cabinet frame 34 that defines the interior region 24 of the cabinet. Telecommunications equipment 36 (schematically represented) is mounted in the interior region 24. The equipment 36 can include, for example, switching or patching equipment, as well as other types of equipment.

The cabinet frame 34 of the present disclosure includes a top frame structure 38, a bottom frame structure 40, a first inner frame 42, and a second outer frame 44. In general, the front and rear panels and the side panels (e.g., 26, 30) of the cabinet 10 mount to the second outer frame 44, while the equipment 36 mounts to the first inner frame 42.

Figure 2:
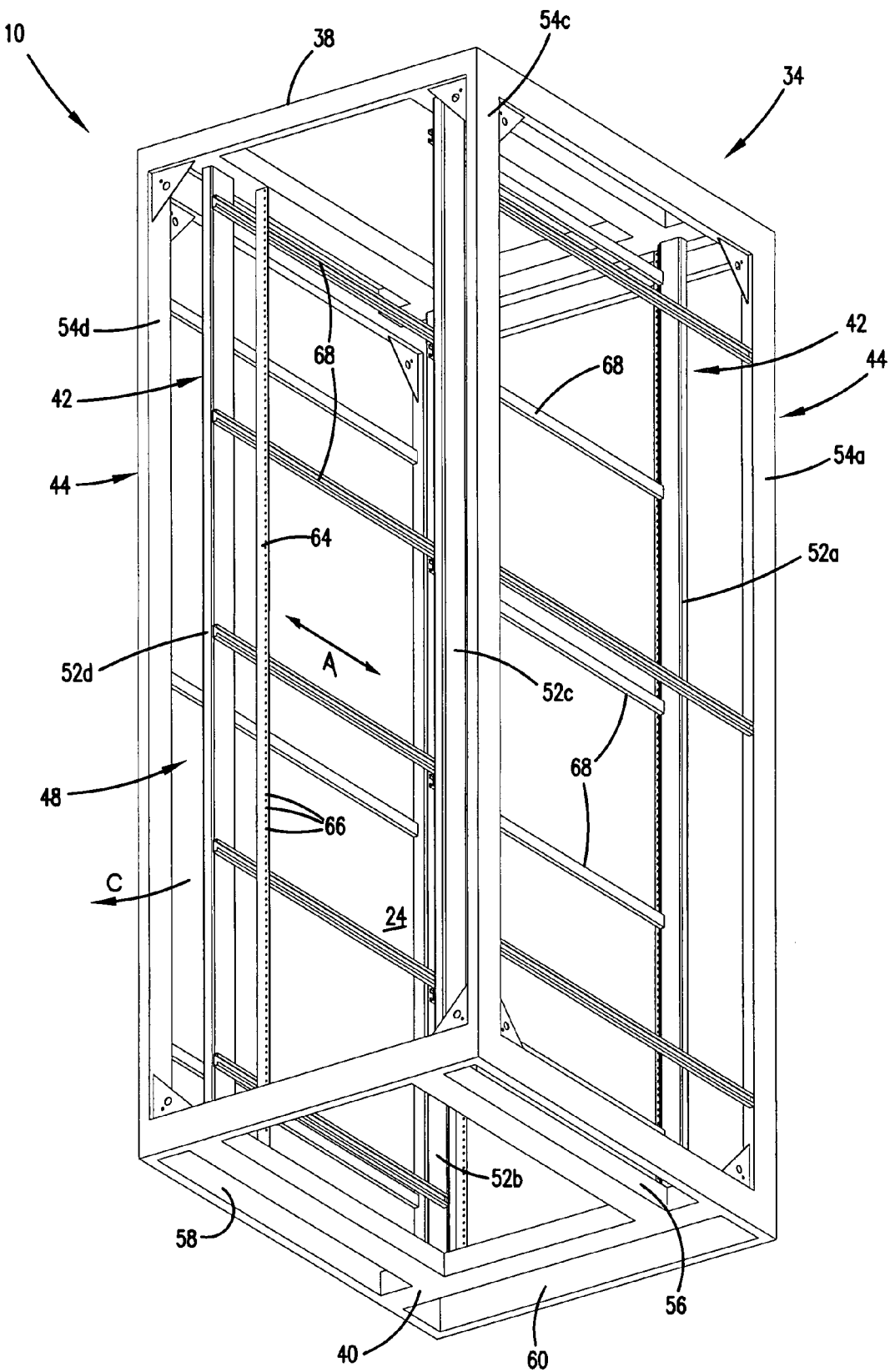
FIG. 2 is a bottom, rear perspective view of the cabinet frame arrangement of the telecommunications cabinet of FIG. 1, shown in isolation.

Referring now to FIGS. 1 and 2, the inner frame 42 includes four inner corner frame members 52, including two front inner frame members 52a, 52b, and two rear inner frame members 52c, 52d. The outer frame 44 also includes four outer corner frame members 54, including two front outer frame members 54a, 54b, and two rear outer frame members 54c, 54d. Each of the inner corner frame members 52 is vertically oriented and interconnected to both the top frame structure 38 and the bottom frame structure 40. Likewise, each of the outer corner frame members 54 is vertically oriented and interconnected to both the top frame structure 38 and the bottom frame structure 40. In one embodiment, the inner and outer corner frame members 52, 54 are welded to the top and bottom frame structure; however, other securing methods can be utilized.

Telecommunications equipment 36 mounts to the inner frame 42. In particular, and referring now to FIGS. 1-4, telecommunications equipment 36 mounts to vertical support brackets including forward support brackets 62 (FIG. 1) and rearward support brackets 64 (FIGS. 1 and 2). The vertical forward brackets 62 are generally fixed in relation to the cabinet frame 34. What is meant by generally fixed is that the brackets are secured to the frame in a non-adjustable manner. The rearward brackets 64, however, are adjustable. In particular, the rearward brackets 64 are positionable or moveable in a forward-rearward direction (represented by arrow A) to accommodated equipment of varying size.

Referring to FIG. 2, in the illustrated embodiment, the rearward support brackets 64 are angled brackets that mount to channeled cross-supports 68. The channeled cross-supports 68 extends between the front inner frame members 52a, 52b, and the rear inner frame members 52c, 52d at each of the sides 16, 18 of the telecommunications cabinet 10. Fasteners (not shown) are used to secure the rearward brackets 64 at a selected location along the length of the channeled cross-supports 68; the selected location depending upon the size of equipment being mounted to the brackets 64. The forward support brackets 62 are fixedly secured to the front inner frame members 52a, 52b. The fixed attachment of the forward brackets 62 provides more structural strength and support in seismic events; however, the forward support brackets can also be mounted to the channeled cross-supports 68 to provide a front-adjustable mounting arrangement in areas that experience little or no seismic activity.

Figure 3:
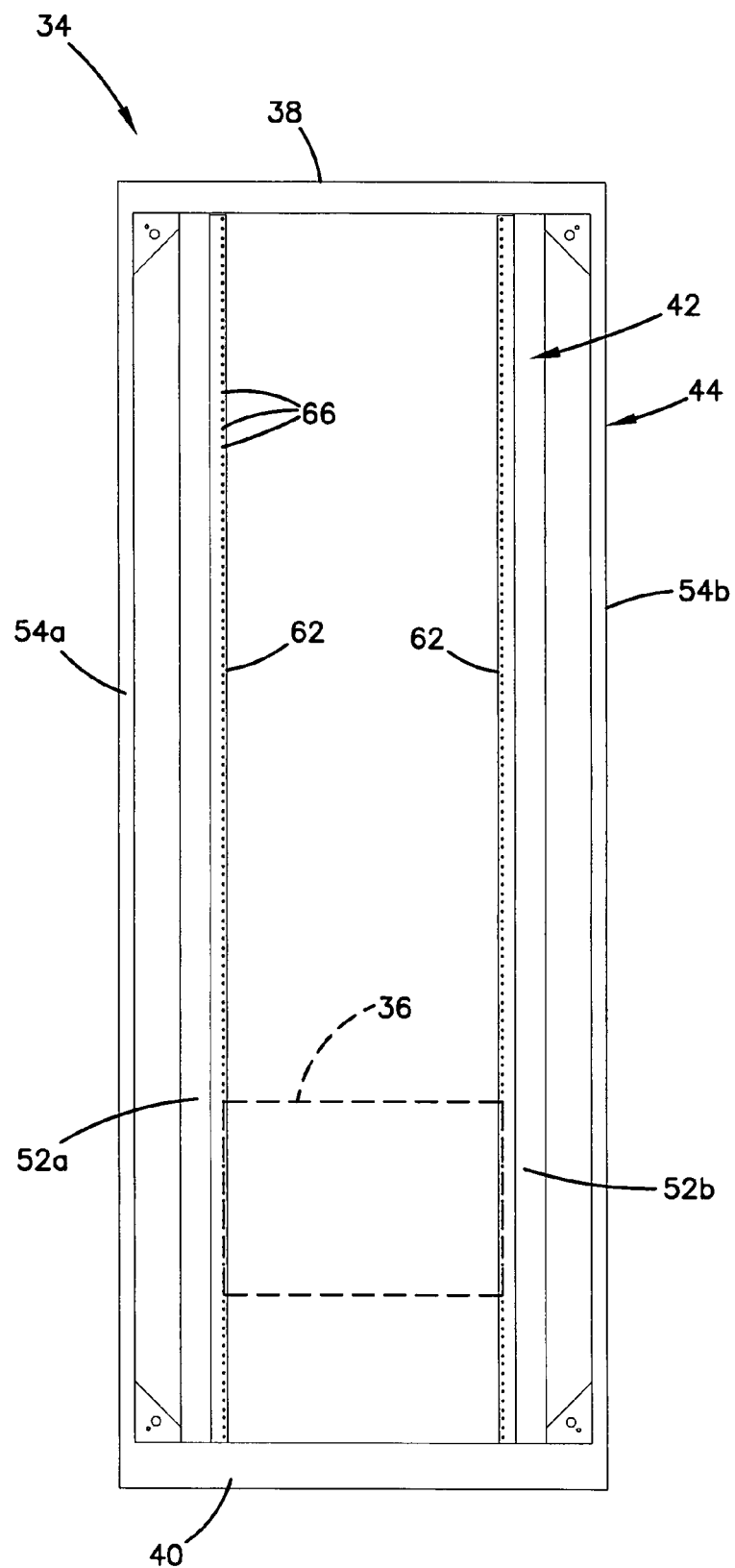
FIG. 3 is a front elevation view of the cabinet frame arrangement of FIG. 2.

Referring to FIGS. 2 and 3, each of the forward and rearward support brackets 62, 64 include mounting structure, such as mounting holes 66 for securing the equipment to the inner frame 42 of the cabinet frame 34. Other bracket mounting structures such as slots or pins can also be provided or utilized in accordance with the principle disclosed.

Figure 4:
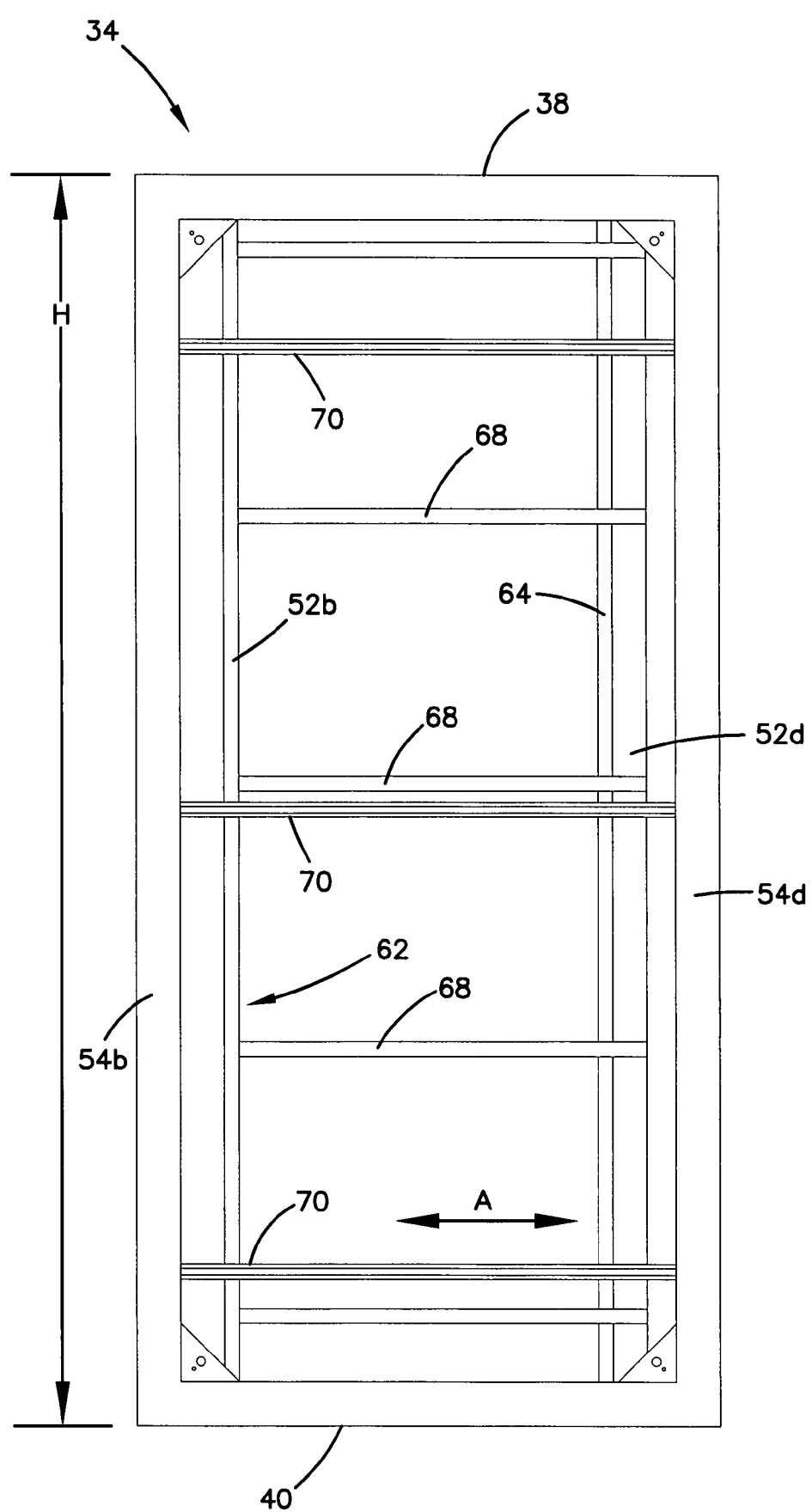
FIG. 4 is a side elevation view of the cabinet frame arrangement of FIG. 3.

As shown in FIGS. 1 and 4, the cabinet frame 34 can also include cross-supports 70 that extend between the front outer frame members 54a, 54b, and the rear outer frame members 54c, 54d at each of the sides 16, 18 of the telecommunications cabinet 10. The cross-supports 68 of the inner frame 42 and the cross-supports 70 of the outer frame 44 enhance the overall structural stability of the cabinet frame 34.

Referring now to FIG. 5, the frame members 52 of the inner frame 42 define an inner frame perimeter P1. The frame members 54 of the outer frame 44 define an outer frame perimeter P2. The inner frame perimeter P1 is smaller than the outer frame perimeter P2 such that the inner frame perimeter is circumscribed by the outer frame perimeter. In the illustrated embodiment, the ratio of the outer frame perimeter P2 to the inner frame perimeter P1 is about 1.2:1.

Referring now to FIGS. 1-2 and 5, the inner frame 42 and the outer frame 44 define side ventilation spaces 46, 48. The side ventilation spaces 46, 48 are located at the sides 16, 18 of the cabinet 10 and extend forward and rearward. Air flow is typically drawn into one of the side ventilation spaces (e.g., 48) through the front 12 of the cabinet, and exits or exhausts through the other side ventilation space (e.g., 46) at the rear 14 of the cabinet.

The side ventilation spaces 46, 48 extend a substantial majority of an overall height H (FIG. 4) of the cabinet 10. This ventilation space configuration provides a large volume that is particularly advantageous at the air-exhaust side (e.g., side ventilation space 46). In use, heated air from equipment is exhausted into the large volume of space, the large volume reducing back pressure problems that can often arise in ventilation systems having smaller constricting volumes.

The ventilation spaces 46, 48 are further sized to accommodate an airflow arrangement that isolates the heat-exhaust region (e.g., side ventilation space 46) from the remaining primary interior region 24. Details of a particular airflow arrangement that can be used with the present cabinet 10 are described in U.S. application Ser. No. 11/799,099, entitled TELECOMMUNICATIONS CABINET WITH AIRFLOW DUCTING; which application is incorporated herein by reference.

Referring again to FIG. 1, the top frame structure 38 defines a plurality of elongated slots, including lateral slots 56, 58 that extend in a forward-rearward direction, and a transverse slot 60 that extends in a side-to-side direction. The elongated slots 56, 58, 60 are formed in an area of the top frame structure 38 between the inner frame perimeter P1 (FIG. 5) and the outer frame perimeter P2. Accordingly, the slots 56, 58, 60 are in fluid communication with the ventilation spaces 46, 48 and additionally aid in facilitating airflow through the interior region 24 of the cabinet 10. The slots also facilitate the passage of cables; that is, each of the slots 56, 58, 60 can further function as an entry or exit location for cables.

Referring to FIG. 2, the bottom frame structure 40 is also provided with slots (56, 58, 60). The bottom slots can likewise facilitate cable passage, and airflow through the interior region 24 of the cabinet in applications where the cabinet includes wheels or casters that space the bottom frame structure 40 from the floor. Providing a single frame structure design that can be utilized for either the top or bottom frame structure also reduces manufacturing costs.

Referring back to FIG. 4, the overall height H of the cabinet 10 and the cabinet frame 34 is greater than 5 feet; preferably the height H is between 6 and 8 feet to effectively utilize limited space in telecommunication facilities. In the illustrated embodiment, the overall height H of the cabinet frame 34 and cabinet 10 is about 7 feet.

The cabinet frame 34 of the present disclosure is sized and constructed to support equipment having a weight of up to 2000 pounds. As can be understood, a cabinet having an overall height of between 6 and 8 feet that houses equipment weighing up to 2000 pounds raises structural stability concerns in regions where seismic activity is possible. The present cabinet frame 34 with the construction of inner and outer frames 42, 44 can, however, withstand seismic Zone 4 events.

Referring now to FIGS. 5-7, each of the inner and outer corner frame members 52, 54 is constructed of rectangular steel tube material, such as one-inch by three-inch steel tube or one-inch by two-inch steel tube. In the illustrated embodiment, the outer corner frame members 54 are constructed of one-inch by three-inch steel tube. Each of the outer corner frame members 54 is oriented such that a front-facing width W1 of the member is the lesser width of the rectangular steel tube construction. Orienting the outer frame members 54 in this manner minimizes the obstruction of cool air intake (represented by arrows B) and of heated air exhaust (represented by arrows C) through the side ventilation spaces 46, 48 of the cabinet 10 (see also FIGS. 1 and 2). (As can be understood, in some applications, airflow can be directed in an opposite flow direction than the direction illustrated.)

Yet, to enhance the structural stability of the cabinet frame 34, the front inner frame members 52a, 52b are transversely oriented to have a front-facing width W2 that is the greater width of the rectangular steel tube construction. Still, it has been found that heat dissipation is an important factor in cabinet design; accordingly, the present frame cabinet balances the need for stability and heat dissipation by orienting only the front inner frame members 52a, 52b transversely. The rear inner frame members 52c, 52d are oriented to have a front-facing width W3 that is the lesser width of the rectangular steel tube construction. Orienting the rear inner frame members 52c, 52d in this manner minimizes the obstruction of exhausting heated air by providing a maximum exhaust area through which heated air can escape. The inner frame 42 and outer frame 44 are thereby constructed to enhance the structural stability of the cabinet frame 34 while providing thermal cooling functionality necessary for proper equipment operations.

In general, the present cabinet frame 34 is constructed to withstand seismic activity while reducing the impact of such construction on air flow circulation through the cabinet. In conventional seismic cabinet frames, the four robust corner posts block air flow critical to maintaining equipment operations. Instead of four large, air-blocking corner posts, the present cabinet frame 34 includes eight smaller corner posts 52, 54 having cross-sectional areas and orientations that minimize airflow obstruction. Yet, the eight corner posts function together as load-bearing members to maintain the structural integrity of the telecommunications cabinet during seismic events.

The above specification provides a complete description of the present invention. Since many embodiments of the invention can be made without departing from the spirit and scope of the invention, certain aspects of the invention reside in the claims hereinafter appended.

What is claimed is:

1. A telecommunications cabinet, comprising:
   a) a cabinet frame defining an interior region, the cabinet frame including:
      i) a top frame structure;
      ii) a bottom frame structure;
      iii) an outer frame including four outer corner frame members, each outer corner frame member interconnected to both of the top frame structure and the bottom frame structure; the outer corner frame members defining an outer frame perimeter; and
      iv) an inner frame including four inner corner frame members, each inner corner frame member interconnected to both of the top frame structure and the bottom frame structure; the inner corner frame members defining an inner frame perimeter circumscribed by the outer frame perimeter; and
   b) telecommunications equipment mounted in the interior region of the frame.

2. The telecommunications cabinet of claim 1, wherein the inner frame and the outer frame define side ventilation spaces therebetween, the side ventilation spaces extending forward and rearward, and extending a substantial majority of a height of the telecommunications cabinet.

3. The telecommunications cabinet of claim 1, wherein the top frame structure defines a plurality of elongated slots that facilitate airflow into the interior region of the cabinet frame.

4. The telecommunications cabinet of claim 3, wherein the elongated slots are formed in an area of the top frame structure between the inner frame perimeter and the outer frame perimeter.

5. The telecommunications cabinet of claim 1, wherein a ratio of the outer frame perimeter to the inner frame perimeter is about 1.2:1.

6. The telecommunications cabinet of claim 1, wherein the inner corner frame members are constructed of rectangular steel tube, front inner corner frame members having a front-facing width that is a greater width of the rectangular steel tube, the rear inner corner frame members having a front-facing width that is a lesser width of the rectangular steel tube.

7. The telecommunications cabinet of claim 6, wherein each of the outer corner frame members are constructed of rectangular steel tube, the outer corner frame members having a front-facing width that is the lesser width of the rectangular steel tube.

8. The telecommunications cabinet of claim 1, wherein the telecommunications equipment is mounted to the inner frame.

9. The telecommunications cabinet of claim 8, wherein the inner frame includes vertical support brackets having mounting holes, the telecommunications equipment being mounted to the vertical support brackets.

10. The telecommunications cabinet of claim 9, wherein the vertical support brackets include rearward support brackets that are adjustable in a forward-rearward direction to accommodate equipment of varying size.

11. The telecommunications cabinet of claim 1, further including a number of cabinet panels attached to the outer frame.

12. The telecommunications cabinet of claim 1, wherein the cabinet frame has a height of between 6 and 8 feet.

13. The telecommunications cabinet of claim 12, wherein the height of the cabinet frame is about 7 feet.

14. The telecommunications cabinet of claim 1, wherein the cabinet frame is constructed to hold equipment weighing up to 2000 pounds.

15. The telecommunications cabinet of claim 1, wherein the cabinet frame is constructed to withstand seismic Zone 4 events.

16. A telecommunications frame arrangement having an overall height of greater than five feet, the frame arrangement comprising;
   a) a top frame structure;
   b) a bottom frame structure;
   c) an outer frame including four outer corner frame members, each outer corner frame member interconnected to both of the top frame structure and the bottom frame structure; the outer frame defining an outer frame perimeter; and
   d) an inner frame including four inner corner frame members, each inner corner frame member interconnected to both of the top frame structure and the bottom frame structure; the inner frame defining an inner frame perimeter circumscribed by the outer frame perimeter;
   e) wherein the inner and outer corner frame members are made of rectangular steel tube.

17. The frame arrangement of claim 16, wherein the cabinet frame is constructed to withstand seismic Zone 4 events.

18. The frame arrangement of claim 16, wherein the cabinet frame is constructed to hold equipment weighing up to 2000 pounds.

19. The frame arrangement of claim 16, wherein front inner corner frame members have a front-facing width that is a greater width of the rectangular steel tube, and the rear inner corner frame members have a front-facing width that is a lesser width of the rectangular steel tube.

20. The frame arrangement of claim 16, further including vertical support brackets having mounting holes to which telecommunications equipment mounts, the vertical support brackets including rearward support brackets that are adjustable in a forward-rearward direction to accommodate equipment of varying size.

21. The frame arrangement of claim 16, wherein the inner frame and the outer frame define side ventilation spaces therebetween, the side ventilation spaces extending forward and rearward, and extending a substantial majority of a height defined from the top frame structure to the bottom frame structure.

22. The frame arrangement of claim 16, wherein the top frame structure defines a plurality of elongated slots that facilitate airflow into an interior region of the frame arrangement.

23. The frame arrangement of claim 22, wherein the elongated slots are formed in an area of the top frame structure between the inner frame perimeter and the outer frame perimeter.

24. The frame arrangement of claim 16, wherein the ratio of the outer frame perimeter to the inner frame perimeter is about 1.2:1.

25. The frame arrangement of claim 16, wherein the overall height of the cabinet frame arrangement extending from the top frame structure to the bottom frame structure is about 7 feet.

* * * * *